United States Patent
Chen et al.

(10) Patent No.: US 11,831,334 B2
(45) Date of Patent: *Nov. 28, 2023

(54) METHOD AND SYSTEM FOR POLAR CODE CODING

(71) Applicant: ZTE CORPORATION, Guangdong (CN)

(72) Inventors: Mengzhu Chen, Guangdong (CN); Jin Xu, Guangdong (CN); Jun Xu, Guangdong (CN)

(73) Assignee: ZTE CORPORATION, Guangdong (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/942,885

(22) Filed: Sep. 12, 2022

(65) Prior Publication Data

US 2023/0231577 A1    Jul. 20, 2023

Related U.S. Application Data

(63) Continuation of application No. 16/830,968, filed on Mar. 26, 2020, now Pat. No. 11,444,639, and a continuation of application No. PCT/CN2017/104522, filed on Sep. 19, 2017.

(51) Int. Cl.
*H03M 13/00* (2006.01)
*H03M 13/13* (2006.01)

(52) U.S. Cl.
CPC ......... *H03M 13/13* (2013.01); *H03M 13/616* (2013.01)

(58) Field of Classification Search
CPC .................... H03M 13/13; H03M 13/616
See application file for complete search history.

(56) References Cited

U.S. PATENT DOCUMENTS

| | | | |
|---|---|---|---|
| 8,347,186 | B1 | 1/2013 | Arikan |
| 10,673,654 | B2 * | 6/2020 | Chen ................. H04L 25/03178 |
| 10,700,809 | B2 * | 6/2020 | Zhang ............... H03M 13/6362 |
| 11,444,639 | B2 * | 9/2022 | Chen .................. H03M 13/616 |
| 2016/0013887 | A1 | 1/2016 | Shen et al. |
| 2016/0308643 | A1 | 10/2016 | Li et al. |
| 2017/0324514 | A1 | 11/2017 | Shen et al. |
| 2018/0323905 | A1 | 11/2018 | Shelby |
| 2019/0081735 | A1 | 3/2019 | Chen et al. |
| 2019/0115997 | A1 | 4/2019 | Chen et al. |
| 2019/0207720 | A1 * | 7/2019 | Li ......................... H04L 1/0041 |
| 2019/0356418 | A1 | 11/2019 | Shieh |
| 2021/0320748 | A1 | 10/2021 | Chen et al. |

FOREIGN PATENT DOCUMENTS

| | | |
|---|---|---|
| CN | 105811998 A | 7/2016 |
| CN | 107113090 A | 8/2017 |
| CN | 107204779 A | 9/2017 |

* cited by examiner

*Primary Examiner* — Samir W Rizk
(74) *Attorney, Agent, or Firm* — Duane Morris LLP

(57) ABSTRACT

A system and method for polar code coding with information bits placed in particular bit indexes are disclosed herein. In one embodiment, a method for channel coding includes: associating, by a polar code encoder, a first bit sequence with first bit indexes of a polar code input; associating, by the polar code encoder, a second bit sequence with second bit indexes, wherein the first bit indexes have a higher reliability than the second bit indexes; and encoding, by the polar code encoder, both the first bit sequence and the second bit sequence using a generator matrix to generate encoded bits.

20 Claims, 4 Drawing Sheets

METHOD AND SYSTEM FOR POLAR CODE CODING

CROSS-REFERENCE TO RELATED APPLICATIONS

The present application is a continuation of U.S. application Ser. No. 16/830,968, filed on Mar. 26, 2020, which claims priority to PCT international application PCT/CN2017/104522, entitled "METHOD AND SYSTEM FOR POLAR CODE CODING," filed on Sep. 29, 2017, each of which is expressly incorporated by reference herein in its entirety.

TECHNICAL FIELD

The disclosure relates generally to wireless communications and, more particularly, to systems and methods for polar code coding with information bits placed in particular bit indexes.

BACKGROUND

In a communications system, channel encoding is generally performed to improve reliability of data transmission and ensure quality of communication. A polar code refers to an encoding technique that can achieve a Shannon limit and has low coding-decoding complexity. The polar code is a linear block code. An encoding process of the polar code may be expressed as $x^N = u^N G_N$. $G_N$ is typically referred to as a generator matrix of the polar code. $x^N$ ($x^N = \{x_1, x_2, \ldots, x_N\}$) is typically referred to as a polar code output or coded block. $u^N$ ($u^N = \{u_1, u_2, \ldots, u_N\}$) is typically referred to as a polar code input. N represents a mother code length (e.g., length of the coded bits), which is required to be a power of 2 (i.e., $2^n$, wherein n is a positive integer).

In general, the bit sequence to be encoded (e.g., as part of the polar code input) may be placed in a plurality of indexes and processed by the generator matrix $G_N$. Since the polar code input and output are required to be an integer power of 2, respectively, when a bit length of a codeword to be transmitted is not the integer power of 2, a rate matching technique is typically performed to discard one or more encoded bits (e.g., one or more bits of the polar code output).

However, due to various application demands in a new radio (NR) wireless communication systems or network, existing polar code encoding techniques are not entirely satisfactory.

SUMMARY

The exemplary embodiments disclosed herein are directed to solving the issues relating to one or more of the problems presented in the prior art, as well as providing additional features that will become readily apparent by reference to the following detailed description when taken in conjunction with the accompany drawings. In accordance with various embodiments, exemplary systems, methods, devices and computer program products are disclosed herein. It is understood, however, that these embodiments are presented by way of example and not limitation, and it will be apparent to those of ordinary skill in the art who read the present disclosure that various modifications to the disclosed embodiments can be made while remaining within the scope of the invention.

In one embodiment, a method for channel coding includes: associating, by a polar code encoder, a first bit sequence with first bit indexes of a polar code input; associating, by the polar code encoder, a second bit sequence with second bit indexes, wherein the first bit indexes have a higher reliability than the second bit indexes; and encoding, by the polar code encoder, both the first bit sequence and the second bit sequence using a generator matrix to generate encoded bits.

In a further embodiment, a method for channel coding includes: receiving, by a polar code decoder, a polar code comprising a first bit sequence and a second bit sequence, wherein: the first bit sequence is associated with first bit indexes, the second bit sequence is associated with second bit indexes, the first bit indexes have a higher reliability than the second bit indexes, and the polar code is encoded using the first bit sequence, the second bit sequence and a generator matrix; and decoding, by the polar code decoder, the polar code.

BRIEF DESCRIPTION OF THE DRAWINGS

Various exemplary embodiments of the invention are described in detail below with reference to the following Figures. The drawings are provided for purposes of illustration only and merely depict exemplary embodiments of the invention to facilitate the reader's understanding of the invention. Therefore, the drawings should not be considered limiting of the breadth, scope, or applicability of the invention. It should be noted that for clarity and ease of illustration these drawings are not necessarily drawn to scale.

DETAILED DESCRIPTION OF EXEMPLARY EMBODIMENTS

Various exemplary embodiments of the invention are described below with reference to the accompanying figures to enable a person of ordinary skill in the art to make and use the invention. As would be apparent to those of ordinary skill in the art, after reading the present disclosure, various changes or modifications to the examples described herein can be made without departing from the scope of the invention. Thus, the present invention is not limited to the exemplary embodiments and applications described and illustrated herein. Additionally, the specific order or hierarchy of steps in the methods disclosed herein are merely exemplary approaches. Based upon design preferences, the specific order or hierarchy of steps of the disclosed methods or processes can be re-arranged while remaining within the scope of the present invention. Thus, those of ordinary skill in the art will understand that the methods and techniques disclosed herein present various steps or acts in a sample order, and the invention is not limited to the specific order or hierarchy presented unless expressly stated otherwise.

The discussion below may refer to functional entities or processes which are similar to those mentioned above with respect to conventional communication systems. As would be understood by persons of ordinary skill in the art, however, such conventional functional entities or processes do not perform the functions described below, and therefore, would need to be modified or specifically configured to perform one or more of the operations described below. Additionally, persons of skill in the art would be enabled to configure functional entities to perform the operations described herein after reading the present disclosure.

Figure 1:
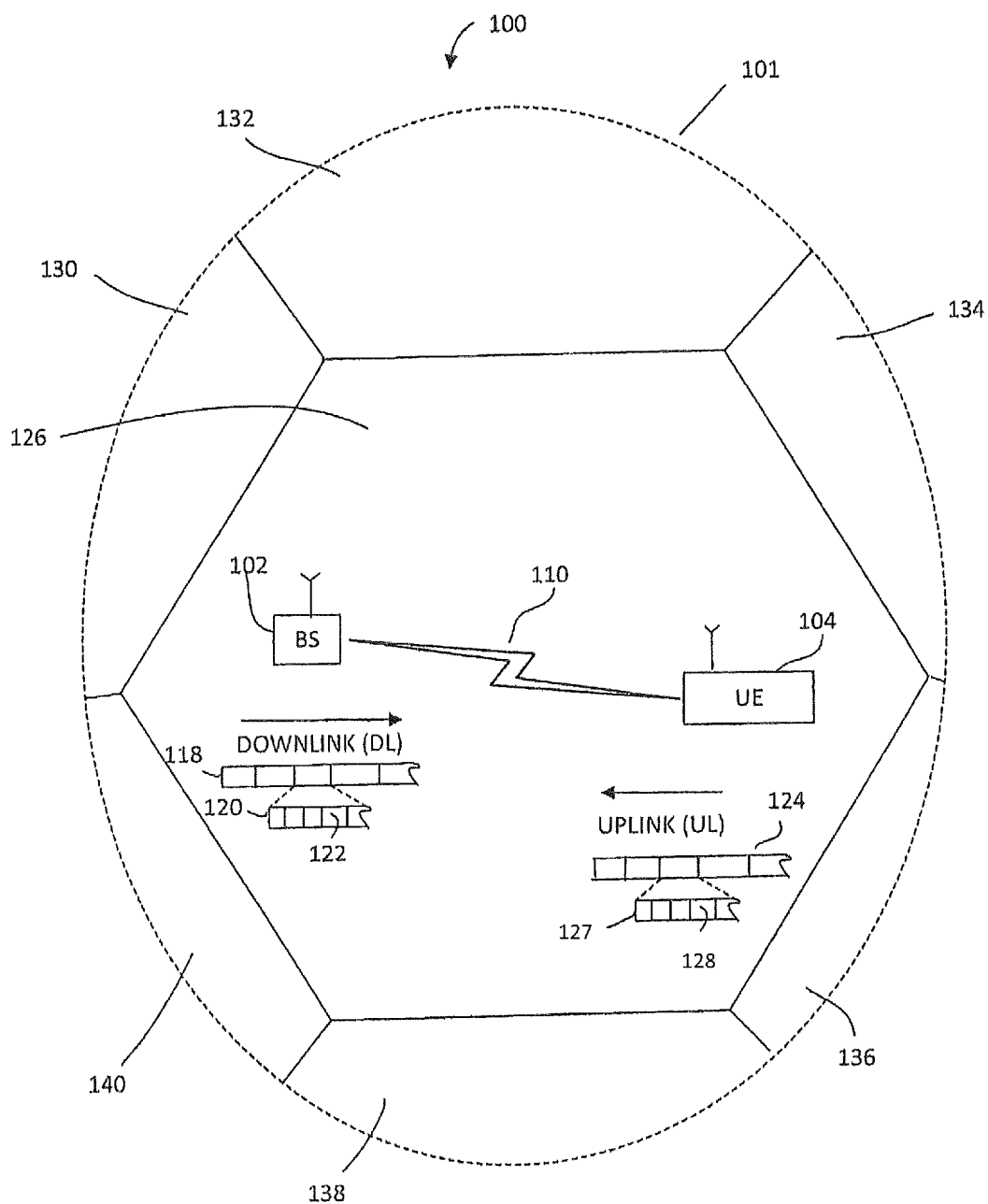
FIG. 1 illustrates an exemplary cellular communication network in which techniques disclosed herein may be implemented, in accordance with an embodiment of the present disclosure.

FIG. 1 illustrates an exemplary wireless communication network 100 in which techniques disclosed herein may be implemented, in accordance with an embodiment of the present disclosure. Such an exemplary network 100 includes a base station 102 (hereinafter "BS 102") and a user equipment device 104 (hereinafter "UE 104") that can communicate with each other via a communication link 110 (e.g., a wireless communication channel), and a cluster of notional cells 126, 130, 132, 134, 136, 138 and 140 overlaying a geographical area 101. In FIG. 1, the BS 102 and UE 104 are contained within a respective geographic boundary of cell 126. Each of the other cells 130, 132, 134, 136, 138 and 140 may include at least one base station operating at its allocated bandwidth to provide adequate radio coverage to its intended users.

For example, the BS 102 may operate at an allocated channel transmission bandwidth to provide adequate coverage to the UE 104. The BS 102 and the UE 104 may communicate via a downlink radio frame 118, and an uplink radio frame 124 respectively. Each radio frame 118/124 may be further divided into sub-frames 120/127 which may include data symbols 122/128. In the present disclosure, the BS 102 and UE 104 are described herein as non-limiting examples of "communication nodes," generally, which can practice the methods disclosed herein. Such communication nodes may be capable of wireless and/or wired communications, in accordance with various embodiments of the invention.

Figure 2:
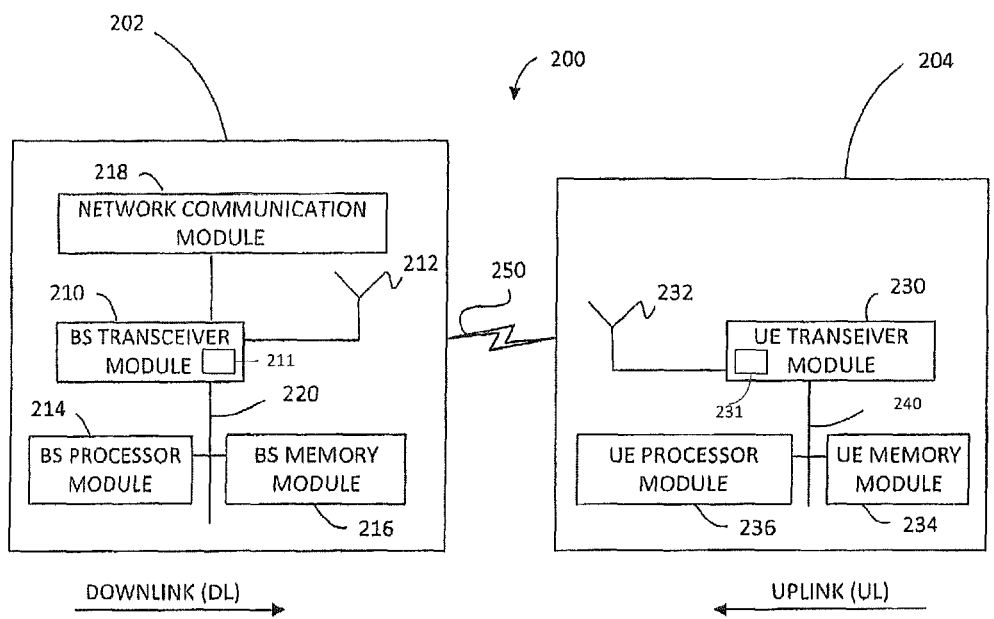
FIG. 2 illustrates block diagrams of an exemplary base station and a user equipment device, in accordance with some embodiments of the present disclosure.

FIG. 2 illustrates a block diagram of an exemplary wireless communication system 200 for transmitting and receiving wireless communication signals, e.g., OFDM/OFDMA signals, in accordance with some embodiments of the invention. The system 200 may include components and elements configured to support known or conventional operating features that need not be described in detail herein. In one exemplary embodiment, system 200 can be used to transmit and receive data symbols in a wireless communication environment such as the wireless communication environment 100 of FIG. 1, as described above.

System 200 generally includes a base station 202 (hereinafter "BS 202") and a user equipment device 204 (hereinafter "UE 204"). The BS 202 includes a BS (base station) transceiver module 210, a BS antenna 212, a BS processor module 214, a BS memory module 216, and a network communication module 218, each module being coupled and interconnected with one another as necessary via a data communication bus 220. The UE 204 includes a UE (user equipment) transceiver module 230, a UE antenna 232, a UE memory module 234, and a UE processor module 236, each module being coupled and interconnected with one another as necessary via a data communication bus 240. The BS 202 communicates with the UE 204 via a communication channel 250, which can be any wireless channel or other medium known in the art suitable for transmission of data as described herein.

As would be understood by persons of ordinary skill in the art, system 200 may further include any number of modules other than the modules shown in FIG. 2. Those skilled in the art will understand that the various illustrative blocks, modules, circuits, and processing logic described in connection with the embodiments disclosed herein may be implemented in hardware, computer-readable software, firmware, or any practical combination thereof. To clearly illustrate this interchangeability and compatibility of hardware, firmware, and software, various illustrative components, blocks, modules, circuits, and steps are described generally in terms of their functionality. Whether such functionality is implemented as hardware, firmware, or software depends upon the particular application and design constraints imposed on the overall system. Those familiar with the concepts described herein may implement such functionality in a suitable manner for each particular application, but such implementation decisions should not be interpreted as limiting the scope of the present invention.

In accordance with some embodiments, the UE transceiver module 230 may be referred to herein as an "uplink" transceiver module 230 that includes a RF transmitter and receiver circuitry that are each coupled to the antenna 232. A duplex switch (not shown) may alternatively couple the uplink transmitter or receiver to the uplink antenna in time duplex fashion. Similarly, in accordance with some embodiments, the BS transceiver module 210 may be referred to herein as a "downlink" transceiver module 210 that includes RF transmitter and receiver circuitry that are each coupled to the antenna 212. A downlink duplex switch may alternatively couple the downlink transmitter or receiver to the downlink antenna 212 in time duplex fashion. The operations of the two transceiver modules 210 and 230 are coordinated in time such that the uplink receiver is coupled to the uplink antenna 232 for reception of transmissions over the wireless transmission link 250 at the same time that the downlink transmitter is coupled to the downlink antenna 212. Preferably there is close time synchronization with only a minimal guard time between changes in duplex direction.

The UE transceiver module 230 and the BS transceiver module 210 are configured to communicate via the wireless data communication link 250, and cooperate with a suitably configured RF antenna arrangement 212/232 that can support a particular wireless communication protocol and modulation scheme. In some exemplary embodiments, the UE transceiver module 210 and the BS transceiver module 210 are configured to support industry standards such as the Long Term Evolution (LTE) and emerging 5G standards, and the like. It is understood, however, that the invention is not necessarily limited in application to a particular standard and associated protocols. Rather, the UE transceiver module 230 and the BS transceiver module 210 may be configured to support alternate, or additional, wireless data communication protocols, including future standards or variations thereof.

In accordance with various embodiments, each of the BS transceiver module 210 and the UE transceiver module 230 includes a polar coding module, 211 and 231. The polar coding module may also be referred to as a polar code coder. In some embodiments, the polar coding module is configured to perform polar code coding from an application of the aforementioned $G_N$ matrix on a polar code input to generate a polar code output. In certain embodiments, the polar coding module may be separated into a separate module that performs encoding and a separate module that performs decoding. Accordingly, the polar coding module that performs polar code encoding may be referred to as a polar code encoder and the polar coding module that performs polar code decoding may be referred to as a polar code decoder. As will be discussed below, such polar code input and output may be processed by at least one of various disclosed techniques so as to satisfy respective application demands. In other embodiments, each of the BS processor module 214 and the UE processor module 236 includes a polar coding module (e.g., as firmware or a processor configured to execute aspects of polar code coding (e.g., encoding and/or decoding) as discussed further below). In yet further embodiments, each of the BS memory module 216 and the UE memory module 234 includes a polar coding module (e.g., as non-transitory computer readable instructions for execution of polar code encoding by a processor module).

In accordance with various embodiments, the BS 202 may be an evolved node B (eNB), a serving eNB, a target eNB, a femto station, or a pico station, for example. In some embodiments, the UE 204 may be embodied in various types of user devices such as a mobile phone, a smart phone, a personal digital assistant (PDA), tablet, laptop computer, wearable computing device, etc. The processor modules 214 and 236 may be implemented, or realized, with a general purpose processor, a content addressable memory, a digital signal processor, an application specific integrated circuit, a field programmable gate array, any suitable programmable logic device, discrete gate or transistor logic, discrete hardware components, or any combination thereof, designed to perform the functions described herein. In this manner, a processor may be realized as a microprocessor, a controller, a microcontroller, a state machine, or the like. A processor may also be implemented as a combination of computing devices, e.g., a combination of a digital signal processor and a microprocessor, a plurality of microprocessors, one or more microprocessors in conjunction with a digital signal processor core, or any other such configuration.

Furthermore, the steps of a method or algorithm described in connection with the embodiments disclosed herein may be embodied directly in hardware, in firmware, in a software module executed by processor modules 214 and 236, respectively, or in any practical combination thereof. The memory modules 216 and 234 may be realized as RAM memory, flash memory, ROM memory, EPROM memory, EEPROM memory, registers, a hard disk, a removable disk, a CD-ROM, or any other form of storage medium known in the art. In this regard, memory modules 216 and 234 may be coupled to the transceiver modules 210 and 230, respectively, such that the transceiver modules 210 and 230 can read information from, and write information to, memory modules 216 and 234, respectively. The memory modules 216 and 234 may also be integrated into their respective transceiver modules 210 and 230. In some embodiments, the memory modules 216 and 234 may each include a cache memory for storing temporary variables or other intermediate information during execution of instructions to be executed by transceiver modules 210 and 230, respectively. Memory modules 216 and 234 may also each include non-volatile memory for storing instructions to be executed by the transceiver modules 210 and 230, respectively.

The network communication module 218 generally represents the hardware, software, firmware, processing logic, and/or other components of the base station 202 that enable bi-directional communication between the BS transceiver module 210 and other network components and communication nodes configured to communication with the base station 202. For example, network communication module 218 may be configured to support internet or WiMAX traffic. In a typical deployment, without limitation, network communication module 218 provides an 802.3 Ethernet interface such that the BS transceiver module 210 can communicate with a conventional Ethernet based computer network. In this manner, the network communication module 218 may include a physical interface for connection to the computer network (e.g., Mobile Switching Center (MSC)). The terms "configured for," "configured to" and conjugations thereof, as used herein with respect to a specified operation or function, refer to a device, component, circuit, structure, machine, signal, etc., that is physically or virtually constructed, programmed, formatted and/or arranged to perform the specified operation or function.

The present disclosure provides various embodiments of systems and methods for polar coding with bit sequence placed in particular bit indexes of a polar code input. By being placed, the bit sequence may be associated, located, or mapped to particular bit indexes for polar encoding (e.g., for processing by a generator matrix to produce a coded block, or polar code output). In certain embodiments, a bit sequence (e.g., a bit sequence to be encoded) may include a first bit sequence and a second bit sequence which is different than the first bit sequence. For example, the first bit sequence may carry specific information, or a particular type or class of information, as will be discussed further below. The first bit sequence may have a lower bit error ratio requirement than the second bit sequence, and may be placed in bit indexes that have higher reliability (e.g., lower bit error ratios) than other bit indexes that place the second bit sequence. A bit error ratio (BER) may be the number of bit errors divided by the total number of transferred (e.g., communicated) bits during a studied time interval. Accordingly, the reliability for the first bit sequence may be increased relative to other bit sequences that may be placed in other bit indexes of the second bit sequence.

As introduced above, a polar code can be expressed as $x^N = u^N G_N$, where $G_N$ is the generator matrix of the polar code, $x^N$ ($x^N = \{x_1, x_2, \ldots, x_N\}$) is the polar code output (e.g., the coded block), $u^N$ ($u^N = \{u_1, u_2, \ldots, u_N\}$) is the polar code input (which may include a bit sequence to be encoded), and N represents a mother code length (e.g., length of the coded bits), which is required to be a power of 2 (i.e., $2^n$, wherein n is a positive integer). As will be discussed further below, the bit error ratio (BER), or the reliability of a bit sequence to be encoded, may vary based upon the value of the bit index (e.g., the placement of bits within the polar code input). Stated another way, the BER may vary based upon the particular index value of the bit sequence to be encoded. For example, each bit within the bit sequence may be placed in a particular index (e.g., be associated with a particular index value), such as where a first bit of the bit sequence may be placed in the first index of the bit index set, the second bit of the bit sequence may be placed in the second index of the bit index set, and so on until the last bit of the bit sequence may be placed in the last index of the bit index set. The totality of the bit indexes for a bit sequence may be referred to as a bit index set.

In certain embodiments, it may be determined that certain indexes (e.g., index values) of the bit index set may have a lower BER than other indexes of the bit index set. These certain indexes may be termed as reliable indexes of the bit index set, to contrast with other indexes of the bit index set that may be less reliable or have a higher BER than the reliable indexes. The particular indexes of the bit index set that may be reliable indexes may be predefined (e.g., held to be an absolute number of bit indexes, such as 5 indexes, irrespective of the code length of the bit index set or the polar code input) or may be variable based upon factors such as the code length of the polar code input and/or the length of the mother code and/or the length of transmitted bits. As will be discussed further below, these reliable indexes of the bit index set may be the initial indexes (e.g., the first indexes, or the indexes with the lowest value of the bit indexes). These reliable indexes of the bit index set may also be the final indexes (e.g., the last indexes, or indexes with the largest value of the bit indexes). These reliable indexes may also be intermediate indexes of the bit indexes between the initial indexes and the final indexes. These reliable indexes of the bit index set may be determinable by a metric value (e.g., thresholding or selecting the largest or smallest ones) from results of an analysis in accordance with a function, such as density evolution, Gaussian approximation, polarization weight, or a row/column weight based relationship, as will be discussed further below. In certain embodiments, these reliable indexes of the bit index set may be indexes of the bit index set that meet a predefined reliability criteria (e.g., have a predefined reliability value).

Accordingly, it may be desirable to associate the first bit sequence (e.g. a bit sequence that may have a higher reliability requirement than other bit sequences) with these reliable indexes (e.g., place more important information bits in the reliable indexes when performing polar coding) so that the reliability for the first bit sequence may be increased relative to other bit sequences that may be placed in other indexes of the bit index set.

In certain embodiments, polar coding may be utilized for a control channel of a particular radio access technology, such as 5G New Radio (NR). Certain types of information that is part of a control channel (e.g., control information) may have a higher reliability requirement than other types of information. These types of information may be expressed as the first bit sequence and be the first bit sequence placed in the reliable indexes of the polar code input (e.g., the reliable indexes of the bit index set). For example, the control channel may include information such as a rank indicator (RI), a channel state information reference signal resource index (CSI-RS RI, or CRI), a precoding type indicator (PTI), a precoding matrix indicator (PMI), a channel quality indicator (CQI), acknowledgement (ACK), and/or negative-acknowledgement (NACK) and the like. In certain embodiments, RI, CRI, PTI, ACK or NACK may have a higher reliability requirement than other information that may be carried by a bit sequence to be encoded. Accordingly, these types of information (e.g., at least one of RI, CRI, PTI, ACK and/or NACK) may be deemed the first bit sequence for placement in the reliable indexes of the polar code input. For example, RI may be expressed as three bits which are placed in three reliable indexes of the polar code input's bit index set. These reliable indexes of the bit index set may be co-located (e.g., sequentially together as part of the bit index set). These reliable indexes of the bit index set of the polar code input may also be not co-located (e.g., not sequentially together as part of the bit index set, such as having two of the three reliable indexes of the bit index set be the first two indexes (e.g., index values) of the bit index set and the other one of the three reliable indexes be the last index (e.g., index value) of the bit index set). The same principle may be applied for sets of certain types of information (e.g., a first bit sequence that includes RI, CRI, PTI, ACK, NACK information types or classes), where different types of information for a first bit sequence may be co-located and/or not co-located.

Figure 3:
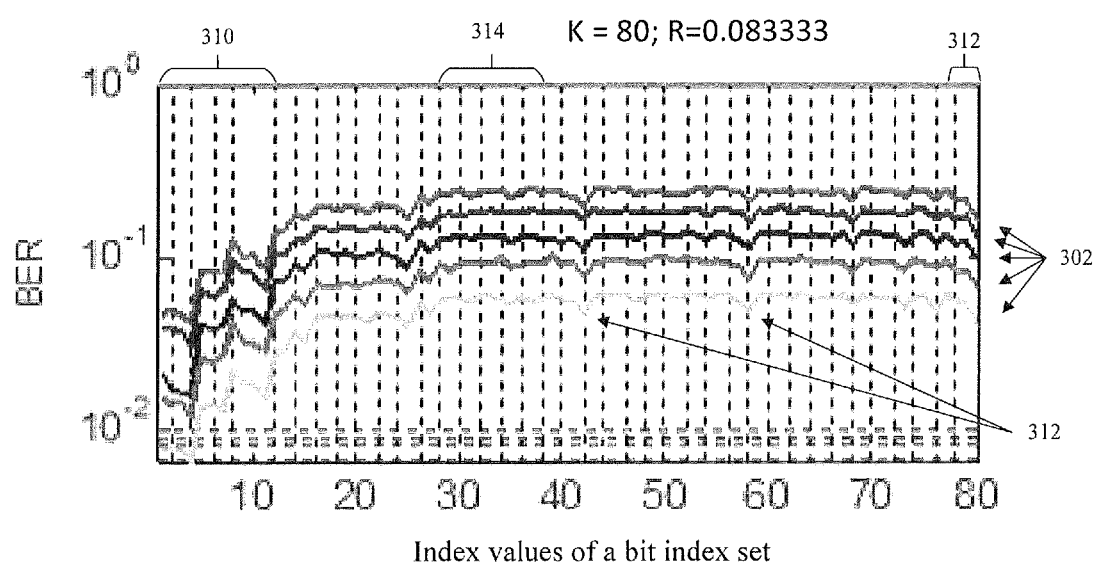
FIG. 3 illustrates a plot of bit error ratio versus index of bit sequence, in accordance with some embodiments of the present disclosure.

FIG. 3 illustrates a plot 300 of bit error ratio versus index of bit sequence in accordance with some embodiments of the present disclosure. The X axis includes an index of a bit sequence (e.g., $1^{st}$-$80^{th}$ bit in the bit sequence) and the Y axis includes the bit error ratio (BER). K is the length of the bit sequence (e.g., number of indexes in the bit index set) and R is the code rate. The different lines 302 represent bit error ratios versus index values for different signal to noise ratios (SNR). The exact SNR values are not important and are not illustrated.

A general trend of particular index values having lower or higher BERs relative to other index values may be determined from the plot 300 of bit error ratio versus index values of the bit sequence For example, the plot 300 of bit error ratio versus index values of the bit sequence at each channel SNR is of a same shape. Stated another way, the shape of each plot is largely parallel (e.g., symmetrical) for each SNR, with the same respective feature (e.g., relative BER value per index value) for each SNR. For example, bits placed in the initial indexes 310 (e.g., around the first 12 bits) may have lower BER than the other bits placed in other indexes within a same SNR. Furthermore, the shape of each plot is in a shape of a bell curve, such as where the BER for each SNR is lower at the bits placed in initial indexes 310 (e.g., from index values of about 1-12) or the bits placed in the final indexes 312 (e.g., from index values of about 78-80) relative to bits placed in certain intermediate indexes 314 (e.g., from index values of around 30-40). Furthermore, there may be valleys 316 among the bits placed in intermediate indexes (e.g., intermediate index values) where the BER is lower than at bits placed in other intermediate indexes.

In various embodiments, a bit sequence (e.g., a first bit sequence) may be placed in (e.g., associated with) reliable indexes that have certain BER and/or reliability criteria or metrics. For example, these reliable indexes may have a lower BER and/or higher reliability relative to other indexes of a bit index set. Any type of criteria or metric for distinguishing reliability for bits placed at particular indexes of a bit index set or for, more generally, identifying bits placed at particular indexes of a bit index set may be utilized to determine a reliable index, such as a particular BER value threshold (e.g., a BER lower than $10^{-2}$), a relative BER threshold (e.g., a BER that is lower than the BER of 80% of the bits at indexes in the bit index set), a predefined index set of an arbitrary indexes irrespective of index length (e.g., first five indexes), metric values as determined by probabilistic function distributions for bit index BERs or capacity (e.g., density evolution or Gaussian approximation), or functions based upon index value (e.g., a function with polarization weight or row weight or column weight or predefined reliability value accorded to particular index values). Accordingly, first bit sequence (that may carry control information) may be placed in reliable indexes of the bit index set that are associated with a lower BER (e.g., higher reliability) than other indexes of the bit index set. Also, the reliability for first bit sequence may be increased relative to other bit sequence that may be placed in other indexes of the bit index set.

In certain embodiments, the reliable indexes may be the initial or smallest indexes of a bit index set. Accordingly, the initial indexes of the bit index set (e.g., smallest index values of a bit index set) may be used to place first bit sequence. For example, when the indexes in Set_I (e.g., the bit index set) are used to place bit sequence, the L1 smallest value indexes in Set_I may be utilized to place first bit sequence, where L1/K≤P1, K is the length of Set_I, and 0≤P1≤1 (e.g. P1=0.2 or 0.5). These first bit sequence may be bit sequence associated with at least one of RI, PTI, ACK, NACK and the like.

In certain embodiments, the reliable indexes may be the initial and final indexes of the bit index set (e.g., largest index value of the bit index set). Accordingly, both the initial and final indexes of the bit index set may be used to place first bit sequence. For example, when the indexes in Set_I (e.g., the bit index set) are used to place bit sequence, the L2 smallest indexes and L3 largest indexes in Set_I may be utilized to place the first bit sequence, where L2/K≤P2, and L3/K≤P3, K is the length of Set_I, and 0≤P2≤1 (e.g. P2=0.2 or 0.5), 0≤P3≤1 (e.g. P3=0.1). These first bit sequence may be sequence bit associated with at least one of RI, CRI, PTI, ACK, NACK and the like.

In certain embodiments, reliable indexes of the bit index set may be determined by a metric value (e.g., via thresholding or selecting the largest or smallest ones) from results of an analysis in accordance with a function. For example, these functions may analyze bit index set BERs or capacity for probabilistic distributions (e.g., density evolution or Gaussian approximation) or functions based upon the bit index set (e.g., a function with polarization weight or row weight or column weight or predefined reliability values accorded to particular index values). The outputs (e.g., results) of these functions may be metric values that may be evaluated, such as by being thresholded (e.g., where reliable indexes are determined as values beyond or under a threshold value) or by selecting the indexes with the largest or smallest L4 metric values, where 0≤L4/K≤1 (e.g. L4/K=0.2 or 0.5). For example, reliable indexes may be indexes of a bit index set that have a particular probabilistic BER or capacity distribution (e.g., a probabilistic BER or capacity distribution over or under a particular threshold value). Functions such as probabilistic distribution techniques (e.g., as density evolution or Gaussian approximation) may be adapted for determination of reliable indexes by being applied to polar coding, but are otherwise conventional and will not be discussed in detail herein for brevity. In certain embodiments, these functions may apply weights that may vary based upon factors such as index values of a bit index set (e.g., certain indexes with higher BER values may have corresponding less weight). Also, as an example of a polarization weight, or a row/column weight based relationship, reliable indexes of the bit index set may be associated with a subset of index values of the bit index set (or be associated with a subset of a weighted polar code row or weighted polar code column). For example, for index i, the polarization weight may be calculated by $\omega_i = \Sum_{i=1}^{n} b_1 \beta^i$ where index i=0, 1, ..., N−1, $b_{n-1}b_{n-2} ... b_1 b_0$ is the binary expansion of i. For index i, the row/column weight is the number of ones of the $i^{th}$ row/column of a polar code generator matrix. As an example of predefined reliability value, for index i, the predefined reliability may be any $R_i$, where i=0, 1, ..., N−1 and $R_i$=0, 1, ..., N−1.

In a number of embodiments, when the indexes in Set_I (e.g., the bit index set) are used to place a bit sequence, L5 indices with metric values (e.g., values as determined by a function) beyond a threshold in Set_I may be determined to be reliable index values for placement of the first bit sequence (e.g., bits associated with at least one of RI, CRI, PTI, ACK or NACK and the like). In certain embodiments, 0≤L5/K≤1 (e.g. L5/K=0.2 or 0.5), K is the length of Set_I. These functions may be applied to determine an aspect of reliability (e.g., BER) for each index value (e.g., each index value of a bit index set) prior to polar coding.

Figure 4:
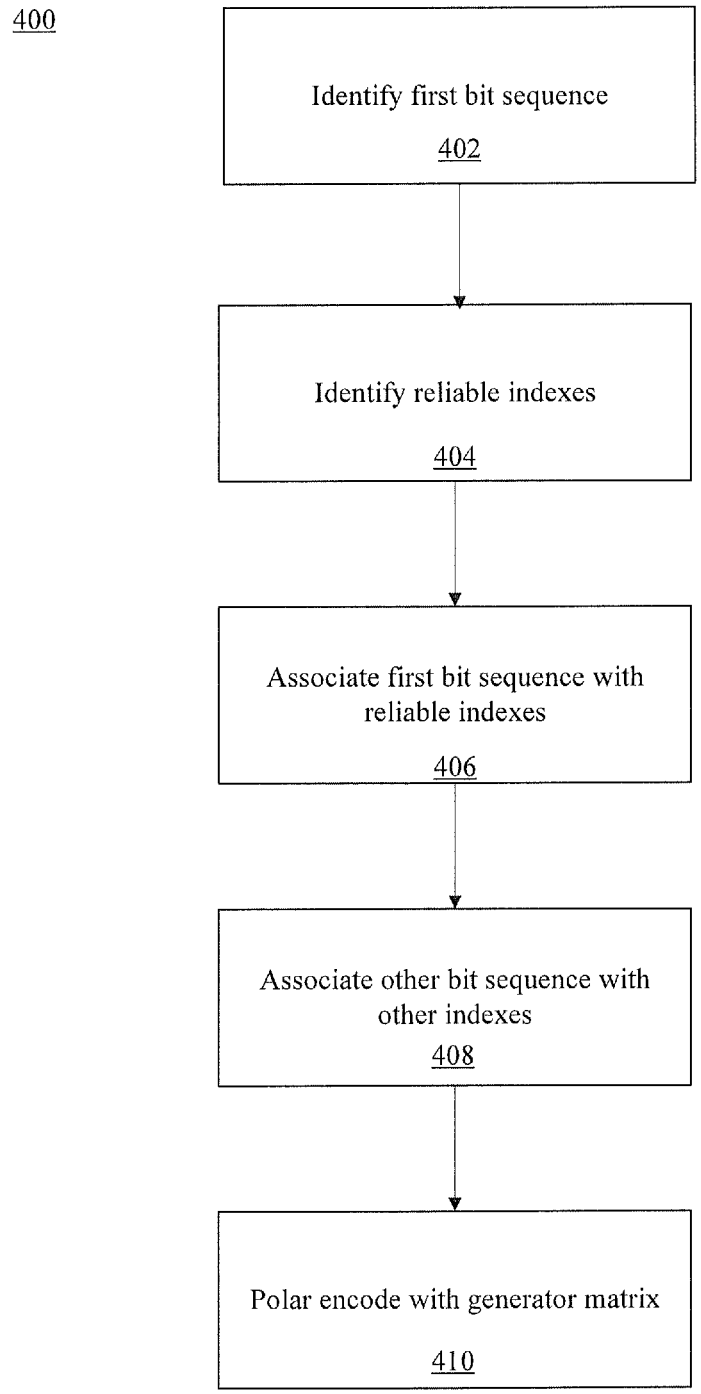
FIG. 4 illustrates a flow chart of an exemplary polar code encoding process, in accordance with some embodiments of the present disclosure.

FIG. 4 illustrates a flow chart of an exemplary polar code encoding process 400, in accordance with some embodiments of the present disclosure. The polar code encoding process 400 may be performed by a communication node and/or a polar coding module, as discussed above. It is noted that the process 400 is merely an example, and is not intended to limit the present disclosure. Accordingly, it is understood that additional operations may be provided before, during, and after the process 400 of FIG. 4, certain operations may be omitted, certain operations may be performed concurrently with other operations, and that some other operations may only be briefly described herein.

At block 402, a polar coding module may identify a first bit sequence. The first bit sequence may be any bit sequence that is associated with information that is differentiable from other information. In certain embodiments, the first bit sequence may be associated with information that is systems critical information or other information from which aspects of a communication system may rely upon. For example, polar coding may be utilized for a control channel of a particular radio access technology, such as 5G New Radio (NR) or 4G Long Term Evolution (LTE). Accordingly, certain types of information that is part of a control channel may have higher BER requirements than other types of information. These types of information with higher BER requirements may be expressed as the first bit sequence and be the first bit sequence placed in reliable indexes of the bit index set. For example, the first bits sequence may include at least one of a rank indicator (RI), a channel state information reference signal resource index (CSI-RS resource index, or CRI), a precoding type indicator (PTI), an acknowledgement (ACK), a negative-acknowledgement (NACK), and the like.

At block 404, the polar coding module may identify reliable indexes of a bit index set. Reliable indexes of a bit index set may be indexes of a bit index set that are associated with lower BER, or higher reliability. The particular indexes that may be reliable indexes of the bit index set may be predefined (e.g., held to be particular indexes of a bit index set, such as 5 initial indexes, irrespective of the code length of the bit index set or mother code length or code length of transmitted bits) or may be variable based upon factors such as the code length of the bit index set or mother code length or code length of transmitted bits. As discussed above, these reliable indexes of the bit index set may be the initial indexes (e.g., the first indexes, or the indexes with the lowest value of the bit index set). These reliable indexes of the bit index set may also be the final indexes (e.g., the last indexes, or indexes with the largest values of the bit index set). These reliable indexes of the bit index set may also be intermediate indexes between the initial indexes or the final indexes. These reliable indexes of the bit index set may be determinable by a metric value (e.g., via thresholding or selecting the largest or smallest ones) from results of an analysis in accordance with a function, such as density evolution, Gaussian approximation, or polarization weight, or a row/column weight or predefined reliability values based relationship. These reliable indexes of the bit index set may be associated with a subset of index values of the bit index set. Further discussion of reliable indexes of the bit index set are provided above.

At block 406, the polar coding module may associate (e.g., place) the first bit sequence with reliable bit indexes. Stated another way, bits of the first bit sequence may be placed in reliable indexes for polar encoding. For example, the first bit sequence may include bits that carry RI. Accordingly, RI may be expressed as three bits which are placed in three reliable indexes of the bit index set. These reliable indexes of the bit index set may be co-located (e.g., sequentially together as part of the bit index set). These reliable indexes of the bit index set may also be separated, or not co-located (e.g., not sequentially together as part of the bit index set, such as having two of the three reliable indexes be the first two indexes of the bit index set and the other one of the three reliable indexes be the last index of the bit index set). The same principle may be applied for different sets or types of information, where different types of the first information may be co-located and/or not co-located. In certain embodiments, reliable indexes may be graded with degrees of reliability and different types, or grades of first information may be placed in these different reliable indexes at different degrees of reliability.

At block 408, the polar coding module may associate (e.g., place) other information (e.g., other bit sequences) in other indexes of the bit index set. Accordingly, the other indexes of the bit index set (e.g., indexes that are not reliable indexes) may be associated with other information that is not part of the information placed in reliable indexes.

At block 410, the polar code module may perform polar coding with the bits of the first bit sequence placed in reliable indexes of the bit index set as discussed above. Polar coding is discussed further above and will not be repeated here for brevity.

While various embodiments of the invention have been described above, it should be understood that they have been presented by way of example only, and not by way of limitation. Likewise, the various diagrams may depict an example architectural or configuration, which are provided to enable persons of ordinary skill in the art to understand exemplary features and functions of the invention. Such persons would understand, however, that the invention is not restricted to the illustrated example architectures or configurations, but can be implemented using a variety of alternative architectures and configurations. Additionally, as would be understood by persons of ordinary skill in the art, one or more features of one embodiment can be combined with one or more features of another embodiment described herein. Thus, the breadth and scope of the present disclosure should not be limited by any of the above-described exemplary embodiments.

It is also understood that any reference to an element herein using a designation such as "first," "second," and so forth does not generally limit the quantity or order of those elements. Rather, these designations can be used herein as a convenient means of distinguishing between two or more elements or instances of an element. Thus, a reference to first and second elements does not mean that only two elements can be employed, or that the first element must precede the second element in some manner.

Additionally, a person having ordinary skill in the art would understand that information and signals can be represented using any of a variety of different technologies and techniques. For example, data, instructions, commands, information, signals, bits and symbols, for example, which may be referenced in the above description can be represented by voltages, currents, electromagnetic waves, magnetic fields or particles, optical fields or particles, or any combination thereof.

A person of ordinary skill in the art would further appreciate that any of the various illustrative logical blocks, modules, processors, means, circuits, methods and functions described in connection with the aspects disclosed herein can be implemented by electronic hardware (e.g., a digital implementation, an analog implementation, or a combination of the two), firmware, various forms of program or design code incorporating instructions (which can be referred to herein, for convenience, as "software" or a "software module"), or any combination of these techniques. To clearly illustrate this interchangeability of hardware, firmware and software, various illustrative components, blocks, modules, circuits, and steps have been described above generally in terms of their functionality. Whether such functionality is implemented as hardware, firmware or software, or a combination of these techniques, depends upon the particular application and design constraints imposed on the overall system. Skilled artisans can implement the described functionality in various ways for each particular application, but such implementation decisions do not cause a departure from the scope of the present disclosure.

Furthermore, a person of ordinary skill in the art would understand that various illustrative logical blocks, modules, devices, components and circuits described herein can be implemented within or performed by an integrated circuit (IC) that can include a general purpose processor, a digital signal processor (DSP), an application specific integrated circuit (ASIC), a field programmable gate array (FPGA) or other programmable logic device, or any combination thereof. The logical blocks, modules, and circuits can further include antennas and/or transceivers to communicate with various components within the network or within the device. A general purpose processor can be a microprocessor, but in the alternative, the processor can be any conventional processor, controller, or state machine. A processor can also be implemented as a combination of computing devices, e.g., a combination of a DSP and a microprocessor, a plurality of microprocessors, one or more microprocessors in conjunction with a DSP core, or any other suitable configuration to perform the functions described herein.

If implemented in software, the functions can be stored as one or more instructions or code on a computer-readable medium. Thus, the steps of a method or algorithm disclosed herein can be implemented as software stored on a computer-readable medium. Computer-readable media includes both computer storage media and communication media including any medium that can be enabled to transfer a computer program or code from one place to another. A storage media can be any available media that can be accessed by a computer. By way of example, and not limitation, such computer-readable media can include RAM, ROM, EEPROM, CD-ROM or other optical disk storage, magnetic disk storage or other magnetic storage devices, or any other medium that can be used to store desired program code in the form of instructions or data structures and that can be accessed by a computer.

In this document, the term "module" as used herein, refers to software, firmware, hardware, and any combination of these elements for performing the associated functions described herein. Additionally, for purpose of discussion, the various modules are described as discrete modules; however, as would be apparent to one of ordinary skill in the art, two or more modules may be combined to form a single module that performs the associated functions according embodiments of the invention.

Additionally, memory or other storage, as well as communication components, may be employed in embodiments of the invention. It will be appreciated that, for clarity purposes, the above description has described embodiments of the invention with reference to different functional units and processors. However, it will be apparent that any suitable distribution of functionality between different functional units, processing logic elements or domains may be used without detracting from the invention. For example, functionality illustrated to be performed by separate processing logic elements, or controllers, may be performed by the same processing logic element, or controller. Hence, references to specific functional units are only references to a suitable means for providing the described functionality, rather than indicative of a strict logical or physical structure or organization.

Various modifications to the implementations described in this disclosure will be readily apparent to those skilled in the art, and the general principles defined herein can be applied to other implementations without departing from the scope of this disclosure. Thus, the disclosure is not intended to be limited to the implementations shown herein, but is to be accorded the widest scope consistent with the novel features and principles disclosed herein, as recited in the claims below.

What is claimed is:

1. A method for channel coding, comprising:
obtaining information bits to be encoded, wherein the information bits comprise a first bit sequence and a second bit sequence, wherein the first bit sequence requires a lower bit error ratio than the second bit sequence;
associating, by a polar code encoder, the first bit sequence of the information bits with first bit indexes of a polar code input;
associating, by the polar code encoder, the second bit sequence of the information bits with second bit indexes of the polar code input, wherein the first bit indexes have a higher reliability than the second bit indexes; and
encoding, by the polar code encoder, both the first bit sequence and the second bit sequence to generate encoded bits.

2. The method of claim 1, wherein the first bit indexes have a lower bit error ratio than the second bit indexes.

3. The method of claim 1, wherein the first bit sequence is associated with control information.

4. The method of claim 1, wherein the first bit sequence is associated with at least one of: a rank indicator, a channel state information reference signal resource index, a precoding type indicator, an acknowledgement, or a negative-acknowledgement.

5. The method of claim 1, wherein:
a bit index set comprises the first bit indexes and the second bit indexes.

6. The method of claim 5, wherein:
the first bit indexes comprise initial indexes of the bit index set.

7. The method of claim 5, wherein:
the first bit indexes comprise final indexes of the bit index set.

8. The method of claim 5, wherein:
the first bit indexes are determined by analyzing the bit index set using at least one of the following techniques: density evolution, Gaussian approximation, polarization weight, row weight, column weight or predefined reliability values.

9. The method of claim 5, wherein:
the first bit indexes are defined irrespective of a size of the bit index set.

10. A method for channel coding, comprising:
receiving, by a polar code decoder, encoded information bits comprising a first bit sequence and a second bit sequence, wherein:
the first bit sequence requires a lower bit error ratio than the second bit sequence,
the first bit sequence is associated with first bit indexes of a polar code,
the second bit sequence is associated with second bit indexes of the polar code,
the first bit indexes have a higher reliability than the second bit indexes, and
the first bit sequence and the second bit sequence are encoded based on the polar code; and
decoding, by the polar code decoder, the encoded information bits based on the polar code.

11. The method of claim 10, wherein the first bit indexes have a lower bit error ratio than the second bit indexes.

12. The method of claim 10, wherein the first bit sequence is associated with control information.

13. The method of claim 10, wherein the first bit sequence is associated with at least one of: a rank indicator, a channel state information reference signal resource index, a precoding type indicator, an acknowledgement, or a negative-acknowledgement.

14. The method of claim 10, wherein:
a bit index set comprises the first bit indexes and the second bit indexes.

15. The method of claim 14, wherein:
the first bit indexes comprise initial indexes of the bit index set.

16. The method of claim 14, wherein:
the first bit indexes comprise final indexes of the bit index set.

17. The method of claim 14, wherein:
the first bit indexes are determined by analyzing the bit index set using at least one of the following techniques: density evolution, Gaussian approximation, polarization weight, row weight, column weight or predefined reliability values.

18. The method of claim 14, wherein:
the first bit indexes are defined irrespective of a size of the bit index set.

19. A communication node comprising a processor and a memory, wherein the memory stores instructions that, when executed, cause the processor to:
obtain information bits to be encoded, wherein the information bits comprise a first bit sequence and a second bit sequence, wherein the first bit sequence requires a lower bit error ratio than the second bit sequence;
associate the first bit sequence of the information bits with first bit indexes of a polar code input;
associate the second bit sequence of the information bits with second bit indexes of the polar code input, wherein the first bit indexes have a higher reliability than the second bit indexes; and
encode both the first bit sequence and the second bit sequence to generate encoded bits.

20. A communication node comprising a processor and a memory, wherein the memory stores instructions that, when executed, cause the processor to:
Receive encoded information bits comprising a first bit sequence and a second bit sequence, wherein:
the first bit sequence requires a lower bit error ratio than the second bit sequence,
the first bit sequence is associated with first bit indexes of a polar code,
the second bit sequence is associated with second bit indexes of the polar code,
the first bit indexes have a higher reliability than the second bit indexes, and
the first bit sequence and the second bit sequence are encoded based on the polar code; and
decode the encoded information bits based on the polar code.

* * * * *